(12) United States Patent
Adkisson et al.

(10) Patent No.: US 6,445,194 B1
(45) Date of Patent: Sep. 3, 2002

(54) STRUCTURE AND METHOD FOR ELECTRICAL METHOD OF DETERMINING FILM CONFORMALITY

(75) Inventors: James W. Adkisson, Jericho, VT (US); Arne W. Ballantine, Round Lake; Ralph W. Young, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 09/788,084

(22) Filed: Feb. 16, 2001

(51) Int. Cl.[7] .............................................. G01R 27/26
(52) U.S. Cl. ...................................................... 324/662
(58) Field of Search ................................ 324/658, 660, 324/662, 663, 671; 427/10; 438/303, 386; 257/300, 301, 305, 506, 513

(56) References Cited

U.S. PATENT DOCUMENTS

| 3,611,126 A | 10/1971 | Lucka |
| 4,600,597 A | 7/1986 | White et al. |
| 4,910,398 A | 3/1990 | Komatsu et al. |
| 4,978,923 A | 12/1990 | Maltiel |
| 5,140,272 A | 8/1992 | Nishimatsu et al. |
| 5,308,740 A | 5/1994 | Templeton et al. |
| 5,386,195 A | 1/1995 | Hayes et al. |
| 5,420,803 A | 5/1995 | Judell |
| 5,517,190 A | 5/1996 | Gunn |
| 5,548,212 A | 8/1996 | Logue |
| 5,701,029 A | 12/1997 | Sasaki |
| 5,770,878 A | 6/1998 | Beasom |
| 5,801,538 A | 9/1998 | Kwon |
| 5,882,243 A | * 3/1999 | Das et al. ...................... 451/5 |
| 5,966,607 A | 10/1999 | Chee et al. |
| 6,310,375 B1 | * 10/2001 | Schrems ...................... 257/301 |

* cited by examiner

*Primary Examiner*—N. Le
*Assistant Examiner*—Etienne LeRoux
(74) *Attorney, Agent, or Firm*—Connolly Bove Lodge & Hutz, LLP; William D. Sabo, Esq.

(57) ABSTRACT

The invention provides a monitor wafer and a method using the wafer to measure the conformality of dielectric films and in particular, for measuring the sidewall deposition thickness of dielectric films.

50 Claims, 1 Drawing Sheet

STRUCTURE AND METHOD FOR ELECTRICAL METHOD OF DETERMINING FILM CONFORMALITY

FIELD OF THE INVENTION

The present invention relates generally to semiconductor devices and methods for their fabrication. Many steps during the process of semiconductor manufacture involve the deposition or growth of thin dielectric films. The present invention relates to a device and method for determining the conformality of such films by capacitance measurement.

BACKGROUND OF INVENTION

Deposited dielectric films are used as insulators for semiconductor devices including sidewall (vertical surface) isolation. A prime exemplar of such film usage is the gate stack sidewall spacer film used to define the distance between the FET gate stack and self-aligned, lightly-doped source/drain areas, LDD, or extension, and contact silicide regions. The actual sidewall thickness defines the functional geometry of the device, and thus determines device performance and yield. A crucial feature of such films is their conformality, the relation of the thickness of the film deposited on a vertical (sidewall) surface to the thickness on a horizontal surface. A film 100% conformal has a sidewall thickness equal to the deposition depth on a horizontal surface. Currently, there is no practical, direct measure of sidewall thickness, this parameter is determined indirectly from measurements of the thickness of deposited dielectric films along horizontal surfaces relying on the relation of the horizontal thickness ($T_h$), the conformality (C), and the vertical thickness ($T_v$): $T_h \times C = T_v$.

Today, ellipsometer measurements of horizontal surfaces are used to control sidewall deposition processes. Moreover, in current monitoring schemes, the conformality is assumed to remain constant. Typically, monitoring is conducted performing a test run of the process using a bare monitor deposited with a planar layer of the film in question, taking ellipsometric readings of the film, and iteratively adjusting process time until desired deposition depth is achieved. Having achieved the predetermined film thickness, production processing ensues.

The control scheme gives assurance that the horizontal coatings are of the appropriate magnitude, but this scheme gives no assurance that conformality has remained unchanged. This is of particular concern in view of the fact that process parameters such as temperature, pressure, and gas flow are known to affect deposition conformality. Where a tool event occurs that alters the process deposition rate, the deposition time is altered to reestablish the predetermined target thickness. However, the present methods do not control for alterations in conformality, and thus the crucial parameter, the sidewall thickness may vary beyond acceptable tolerances.

To improve process productivity, a measure of conformality is essential. There are presently available two methods. The first method, measurement of cross sections by TEM, is barely capable of the requisite 10 Å resolution, is expensive, has a very long mean time to detect, and its reported measurements are dependent on the TEM operator. The second method measures the electrical $L_{eff}$ or overlap capacitance, $C_{ovl}$, of a device. This method is quite costly and has an unacceptably long mean time to detect, often requiring an additional three to four weeks of wafer processing before measurements can be made.

To control sidewall deposition processes, an inexpensive, short mean time to detect monitor of conformality is required.

SUMMARY OF INVENTION

Broadly, the invention provides capacitors for which an insulating film whose properties are to be determined serves as the insulation layer. Furthermore the invention provides at least two such capacitors, greatly differing in aspect ratio, paired in such manner that their respective capacitance is dominated by either a horizontal component or a vertical component. Appropriately analyzed, this difference in capacitance allows a determination of the conformality of the insulating film. Moreover, the invention provides that the high and low aspect ratio capacitors may be built on the same wafer or on separate wafers. The invention confers the advantage of a low cost measure of conformality with a very low turn around time.

The invention provides for the monitoring of changes in film conformality during the manufacturing process and permits regulation of the manufacturing process wherein it departs from optimum.

The invention provides means of determining film conformality capable of resolutions below 10 Å (angstroms).

In addition, the invention provides means of determining film conformality sensitive to the actual conditions that obtain during a production manufacturing run.

Process parameters such as temperature, pressure, gas flow, and tool events are known to affect film conformality. In additional to its other advantages, the invention provides quick and inexpensive means for determining which process parameter(s) are most critical for control of film conformality.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures wherein similar numbers refer to corresponding structures.

DETAILED DESCRIPTION OF THE PREFERRED EMBODIMENTS

Reference is made to the figures to illustrate selected embodiments and preferred modes of carrying out the invention. It is to be understood that the invention is not hereby limited to those aspects depicted in the figures.

To achieve maximum contrast, the method compares the capacitance of a monitor structure having a large ratio of its upper surface area to the area of its sidewall against the capacitance of a monitor structure comprised of an array of conductive stripes having minimum line widths. Such a structure will have nearly equal sidewall and upper surface areas and therefore a low ratio of upper surface to sidewall areas.

Figure 1:
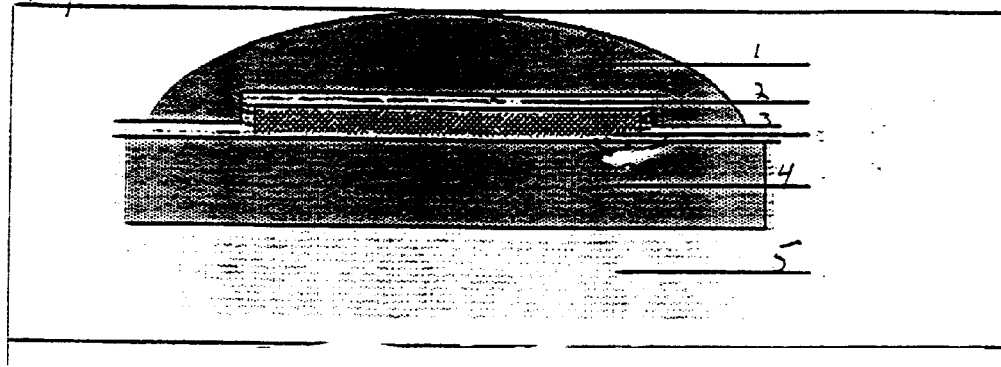
FIG. 1 is a schematic cross-section through a wafer provided a single, low perimeter/area ratio capacitor.
Figure 2:
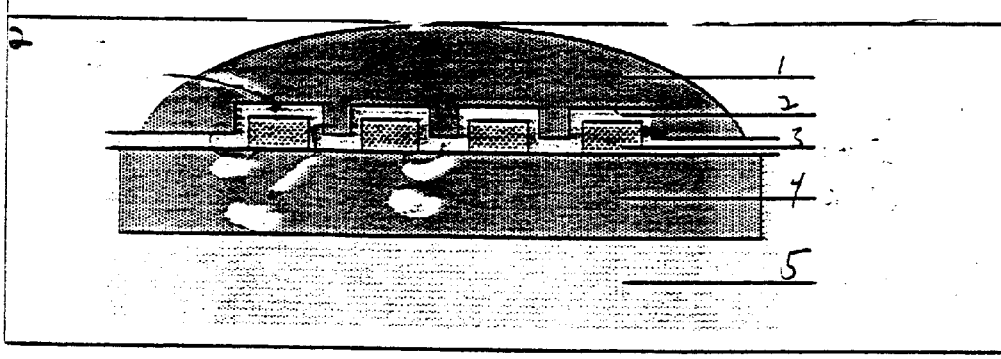
FIG. 2 is a schematic cross-section through a wafer provided a high perimeter/area ratio capacitor.

FIG. 1 depicts a monitor comprised of shallow trench isolation 4 embedded in a semiconductor wafer 5. A large conductive pad 3 occupies substantially the entire central area of wafer 5. A film of study 2 overlays the conductive pad 3 and portions of the STI 4. The film 2 is overlayed with an electrically conductive material 1. The configuration of FIG. 1 results in a capacitor having a large ratio of upper surface to sidewall area. The ratio is typically at least 100:1 and preferably 200 or 300:1. Turning to FIG. 2, a low surface area ratio monitor is depicted. Notice that the conductive pad 3 comprises an array of conductive lines. The area ratio for such a monitor is typically about 1:1 and preferably about 0.5:1. At least two separate monitors, of differing aspect ratio, are needed because different parameters are obtained from each. Therefore, the invention describes monitors of maximum and minimum dimensions. These monitors may be collocated on a single wafer or the two types of monitor may be separately built on distinct wafers. Claims are directed to each of these embodiments.

The pre-built monitor incorporates two levels of preparatory processing. First, shallow trench isolation 4, typically, field isolation, such as field oxide is prepared in a pattern, in a silicon substrate 5. The dielectric layer underneath the conductive plate of fingers should be thick relative to the deposited film under study to avoid adding capacitance between either the top or bottom plate to the substrate. This film is envisioned to be silicon dioxide, and on the order of 400 nm thick. This oxide should extend beyond either the top or bottom patterned conductive layers, again to avoid adding stray capacitance to the measurement. The field oxide is of sufficient thickness that the measurements are neither sensitive to the field oxide thickness nor to the doping of the silicon beneath the field oxide. Next, conductive pads 3, comprising, for example, polycrystalline silicon (or any suitable patternable, conductive material) structures are formed by deposition and patterning. Heavily doped and highly conductive polysilicon layers are preferred for the bottom conductive plate because of its ease in patterning. Other films could also be used if the sidewall angles and the line width of the films can be tightly controlled. Alternatives include metals, for example Al or W, or silicides, for example WSi.

The patterning of the poly structures is such to create monitor pads with at least two differing line widths. The highest contrast is achieved employing the extremes of a large pad with maximum dimension. The pad should be at least 100 micrometers by 100 micrometers. For typical capacitance meters, measurements on the order of approximately 50 pF can be made with high accuracy. Therefore, the minimum area of the structure is $A = (d \cdot C_{tester\_min})/(\epsilon \cdot \epsilon_0)$, where d is the thickness of the deposited dielectric. For dielectric thicknesses between 100 and 1000 Å, round capacitors on the order of 50–200 μm would be sufficient. For a typical mask structure, different sizes would be provided to allow optimum measurements of different thicknesses. For example, while the maximum size will allow the best capacitance measurement for the typical dielectric, real dielectrics will have defects and current flow such that a very large capacitor may in fact not allow for the best measurement. Typically, the large, substantially planar capacitor, is used and readings obtained therefrom are compared against readings obtained from a monitor containing conductive pads of minimum line dimensions. The minimum dimension is limited by the resolution of the photolithography system being employed in the process being monitored. The minimum dimensions are on the order of tenths of a micron. Ideally the minimum line width and the patterned film thickness should be comparable so that the area on the side of the patterned film is appreciable compared to the area on the top of the patterned film in the high perimeter/area ratio structure. The minimum line width that can be fabricated routinely should be used. Errors can be introduced into the measurement by line width variation. Since determining the edge capacitance requires subtracting the top capacitance of the lines, if the line width is not repeatable, the measurement will be less accurate. For a typical technology generation, choosing a line width slightly larger than the minimum offered is preferred. Typical line widths are envisioned to be less than 250 nm, with line widths down to 70 nm or less possible. If polysilicon lines are used, resistance effects may need to be considered if the dielectric is leaky or if the capacitance meter uses high frequency. The accuracy of the resulting conformality determination may be improved by careful measurement of line width and thickness. Conformality is determined by comparing the capacitance measured using monitors of maximum and minimum dimensions. In alternative embodiments, a single monitor pad would be constructed having a large conductive pad on a first region of the wafer and a series of small conductive pads on a second region of the wafer. Typically, the dimensions of the large pad are 100 nanometers by 100 nanometers, but other dimensions could be used, and the line widths of the small pads are on the order of tenths of a micron. Typically the dimensions of the pads will be same as determined for the minimum structure area.

Once the wafer is fabricated with the conductive bottom plate, the dielectric film being studied 2 is deposited or grown. Numerous techniques could be used including low pressure CVD (LPCVD), Rapid Thermal CVD (RTCVD), Plasma Enhanced CVD (PECVD), Oxidation of the polysilicon by various means, sputtering, etc. Following deposition of the dielectric film conductor dots are placed over the areas containing the conductive bottom layers. If existing tests are available for testing oxide quality, the arrays of deposited dots and underlying films can be designed to match the existing tester/deposition. Ideally, the pattern on the wafer can be formed in such a way as to allow a non-critical evaporation mask to be used for the metal dots. Alternatively, a mask can be used to pattern the metal more precisely. Following deposition of the film, a defined array of conductive dots 1 is placed over the areas containing the conductive pads. Typically, the conductive dots are aluminum, but other conductive materials may be substituted. Currently, a repeating array of 1–4 mm Al dots is used. The completed structure is appropriately placed in an industry standard MOS tester such that the conductive lines form a first conductor, the aluminum dots form a second conductor, and the film of study forms a dielectric. The capacitance of this configuration is measured.

The capacitance of the monitor having the maximum dimension determines the electrical thickness of the film. The electrical thickness is a combination of the film's dielectric constant and its physical thickness. The electrical film thickness=(dielectric constant of the film×permitivity of free space)/(measured capacitance per unit area). For a simple parallel plate capacitor, the capacitance per unit area is $\epsilon \cdot \epsilon_0/d$, where d is thickness of the dielectric, and $\epsilon$ is the dielectric constant of the film. Direct measure of the physical thickness will improve accuracy of the overall method by insuring that film stoichiometry remains constant. For example, silicon dioxide, $SiO_2$, has a stoichiometry of 2 oxygen atoms for each silicon atom. If the ratio varies from 2:1 the dielectric constant changes slightly. Since the measured capacitance is a function of both the film thickness and dielectric constant, an independent measure of the film thickness will ensure that changes in capacitance are due to thickness rather than a change in the film's composition. Where the monitor consists of a single, horizontal pad with minimum sidewall, the measured capacitance is attributable, almost entirely, to the area component of capacitance which reflects the horizontal film thickness (FIG. 1). Monitor structures with minimum line dimensions have greatly enhanced sidewall area and the measured capacitance is dominated by the capacitance component assignable to the sidewall thickness (FIG. 2).

In order to determine the conformality of the film, measurement of both the structure with large sidewall area and negligible sidewall area are required. Assuming that the height of the lower conductor is sufficiently high relative to the thickness of the deposited dielectric, a simple relationship may be derived for the conformality of the film. The measured total capacitance of the structure with high sidewall area can be defined as $C_T = C'_{top} \cdot A_{top} + C'_{per} \cdot A_{per}$ where the C' terms are the capacitance per unit area for the top of the bottom conductor and the sidewall of the bottom conductor respectively. The measurement on the flat capacitor with negligible sidewall area is $C_{flat} = C'_{flat} \cdot A_{flat} + \delta_{per}$, where $\delta_{per}$ is the small (<1%) capacitance measured at the edge of the structure. We assume that the thickness of the deposited dielectric on a large flat area is equivalent to that deposited over an array of narrow lines. While using the two structures described above would not be adequate to determine the difference, adding additional structures with changing line widths would be able to see this effect. With this assumption, $C'_{flat} = C'_{top}$.

Using the parallel plate capacitance model and neglecting fringing fields, the capacitance per unit area can be found to be $\epsilon \cdot \epsilon_0/d$, where d is the thickness. Hence, $d_{per} = [C_T - C_{flat}(A_{top}/A_{flat})]/[A_{per}(\epsilon \cdot \epsilon_0)]$ and $d_{top} = C_{flat}/[A_{flat}(\epsilon \cdot \epsilon_0)]$. The total capacitance of the structure with lines and the flat capacitance of the plate are measured, the areas are known from the layout (and additional line width measurements, if necessary), and the dielectric constant is either known or can be measured using other methods (e.g., optically). Therefore, the conformality, using measured or known parameters, may be written as:

$$\text{Conformality} = d_{per}/d_{top} = [C_{flat}/A_{flat}]/\{[C_T - C_{flat}(A_{top}/A_{flat})]/(A_{per})\}$$

$$= (A_{per}/A_{flat}) \times \{C_{flat}/[C_T - C_{flat}(A_{top}/A_{flat})]\}$$

According to an aspect of the present invention, a first capacitor, having a large ratio of upper surface area to sidewall area, is provided. The area ratio should be at least 100:1 and preferably 200:1 or even 300:1. According to an aspect of the present invention, a second capacitor, having a small ratio of upper surface area to sidewall area, is provided. The small area ratio should be as small as practical. Ratios of 1:1 are acceptable, but ratios of 0.5: are preferred.

According to a first embodiment of the invention, the two types of capacitors are built on separate wafers and $C_{flat}$ and $C_T$ are measured using two distinct wafers. According to a second embodiment of the invention, the two types of capacitor are built on the same wafer which is used to obtain both capacitance measures.

Figure 3:
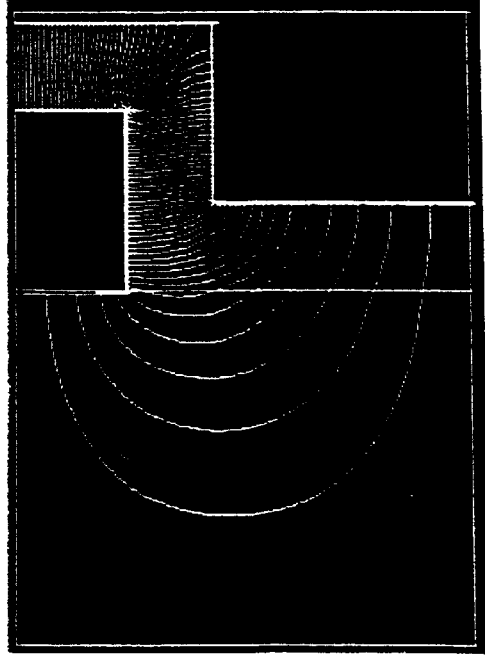
FIG. 3 is a model calculation of the capacitance field lines for a conformal film thickness of 1000 Å with a conformality of 1.0.
Figure 4:
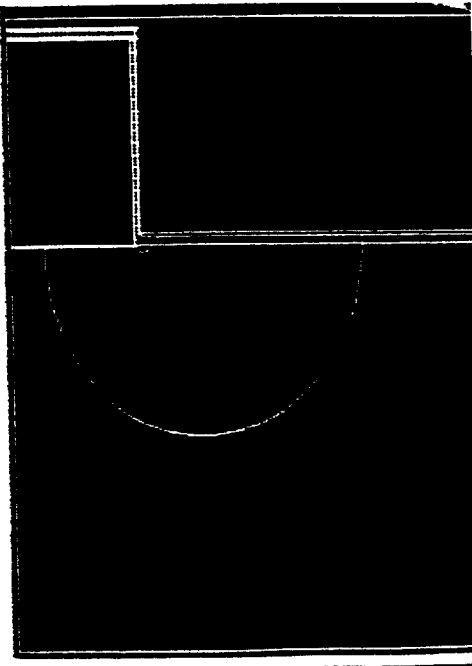
FIG. 4 is a model calculation of the capacitance field lines for a conformal film thickness of 100 Å with a conformality of 0.6.

Turning now to FIGS. 3 and 4, experiments demonstrate that the device and method are quite sensitive to changes in conformality. See Table 1. Model calculations demonstrate that there is no field fringing problem for a wide range of conformal film thicknesses. The concern is whether the capacitance measurements are measuring the capacitance of a parallel plate-like structure (straight lines across the dielectric) or whether the measurement is dominated by fringing fields (curved lines extending below the dielectric). Since the charge per unit area is proportional to the electric field density (lines across the dielectric in the figure), having very few field line below the dielectric shows that the change in the charge on each plate of the capacitor, and hence, the capacitance measured, is essentially determined only by the dielectric being studied and not by additional fringing terms that add error to the measurement. Note that as the thickness of the dielectric becomes large relative to the height of the line, the parallel plate assumption will break down. In this case, using a simulation to model the capacitance would be helpful—numerous Poisson equation solvers are commercially available (for example, PISCES, GEMINI, MINIMOS, MEDICE, etc.). The error in the simple parallel plate approximation is less than 7% for all the simulations despite neglecting the corner region and fringing fields. See FIG. 3. Even for a 1000 Å deposition of silicon nitride the field lines do not substantially penetrate the isolation oxide, but rather reside in the poly line, dielectric film, and the aluminum dot. As expected, the full poisson simulation will typically predict a higher capacitance since additional terms are added. However, these errors still allow conformality values to be determined to better than 10% even with the simple parallel plate model, with larger errors at higher conformalities and thicker dielectrics. If these errors are too large, then full simulations may be compared with a the parallel plate model to build a table of correction factors, F. The values will be a function of the deposited thickness and the uncorrected conformality. The conformality equation is then modified as below:

$$\text{Conformality} = F \cdot A_{per}/A_{flat} \times \{C_{flat}/[C_T - C_{flat}(A_{top}/A_{flat})]\}$$

TABLE I

| Poly Height μm | Poly Width μm | Poly Space μm | Nitride Thk μm | Nit Conformality | Nit Diel Cnst | Total Cap/edge fF/μm | Perim Cap/edge fF/μm |
|---|---|---|---|---|---|---|---|
| 0.2 | 0.25 | 0.25 | 0.01 | 1.00 | 7 | 2.0833 | 1.3080 |
| 0.2 | 0.25 | 0.25 | 0.01 | 0.60 | 7 | 2.8960 | 2.1207 |
| 0.2 | 0.25 | 0.25 | 0.03 | 1.00 | 7 | 0.7147 | 0.4563 |
| 0.2 | 0.25 | 0.25 | 0.03 | 0.60 | 7 | 0.9722 | 0.7138 |
| 0.2 | 0.25 | 0.25 | 0.10 | 1.00 | 7 | 0.2154 | 0.1378 |
| 0.2 | 0.25 | 0.25 | 0.10 | 0.60 | 7 | 0.2821 | 0.2045 |

To obtain the horizontal component of the film capacitance, a monitor comprising a wafer with a defined pattern of electrically insulating material, a field oxide or other suitable material, depositing on the field oxide a conductive pad, covering substantially the entire surface of the wafer, but leaving the outer, annular area uncovered, large area structure can be from 1000 um×100 um to almost the whole wafer. The large perimeter structure can be of comparable size. The important thing is that the total capacitance $C_T$ be dominated by $C'_{per}$ and that the perimeter term in $C_{flat}$, $\delta_{per}$, be negligible. The thickness of the patterned poly film is important for the perimeter structure. The sidewall area should be comparable to the top area in this structure. These concepts are very familiar to those skilled in the art.

The monitor designed to measure the perimeter capacitance typically has a similar total capacitance as the flat monitor. Therefore, the total area determined by summing the vertical and horizontal areas should be similar to the flat monitor. Assuming that lines are 250 nm wide and spaced 250 nm apart and 250 nm high, the total capacitance for the same size structure is higher for the patterned monitor since in the same repeating area the capacitance is 3/2 what it would be in an unpatterned monitor. Therefore, an area similar to the flat monitor is appropriate for this monitor as well, since the measured capacitance will be on the same order of magnitude. A more appropriate line and space pattern of 125 nm lines, 150 nm high spaced 250 nm apart makes the capacitances similar to within 15% for the flat and patterned structures. Clearly, many line and space patterns are appropriate, and it will be clear to those skilled in the art that multiple structures with different spacings will give the maximum information on the process variations.

The entire poly pad is covered with the film of study to a depth determined by the target sidewall thickness. The film typically is silicon oxide, but silicon nitride can be used as well as other materials including organic films. The flat capacitor to determine the top capacitance and the capacitor to determine the perimeter capacitance will be covered with the dielectric to be studied, with the thickness and type of dielectric determined by what is demanded in the product. Compromises in thickness may be made at the cost of monitoring a similar, but not exactly the same, dielectric deposition process. Any dielectric material that allows capacitance measurements, that is, does not pass so much current that the capacitance measurement is overwhelmed by leakage currents, can be used, and small structures will allow structures with higher leakages to be measured, albeit at the cost of smaller capacitances being measured and thus closer to the noise floor of the measurement of the instrument. Dielectrics to be measured are unlimited, but technologically interesting ones are silicon oxides and nitrides (e.g., $SiO_2$, $Si_3N_4$, $SiO_xN_y$), metal oxides ($Al_2O_3$, $ZrSiO_4$, $TiO_2$, $Ta_2O_5$, $ZrO_2$, etc.), perovskites (e.g., Ba, $Sr(TiO_3$, $La_2O_3$, etc.) and combinations of the above may be measured.

Finally an array of electrically conductive dots is deposited on the film. The electrically conductive dots typically are 1–4 millimeter diameter aluminum dots, but they may be larger or smaller. Alternatively, other electrical conductors may be used such as gold, silver, copper, or any other suitable conductor. Finally, a layer of metal will be applied to improve probing of the capacitance measurement structures. These patterns can be blindly applied in an array, for compatibility with existing equipment and elimination of a masking step at the cost of complications in choosing where to probe and analysis of the data. Alternatively, a mask designed for this purpose may be used, in which case the electrical test patterns would be chosen for compatibility with existing probe sets. Patterns of 1–4 mm dots may be chosen for a very simple test pad, or a patterned 1×25 array of much smaller pads (e.g., 0.1 mm×0.1 mm) could be chosen.

To obtain the sidewall component of film capacitance, an array of poly lines, built at a pitch slightly relaxed from the technology minimum, and with a line width slightly larger than the technology minimum is preferred, with the height of the lines set by the height used in the technology. As this is a monitor, other pitches, line widths, and heights are acceptable and taller lines would be preferred.

To maximize the sidewall component of the total capacitance, the aspect ratio, the ratio of the upper surface area to the sidewall area, should be as small as practical, with ratios of 1:1 acceptable, but 0.5:1 preferred.

Various additional structures can be imagined by those skilled in the art, but could, for example, comprise various sizes of flat and perimeter capacitors to allow an optimized capacitance measurement for various thicknesses; various pitches of poly lines to determine conformality as a function of pitch and various line widths to verify the assumption that the deposited dielectric has the same thickness on top of regions with lines as those that are flat.

It will, therefore, be appreciated by those skilled in the art having the benefit of this disclosure that this invention is capable of producing monitor wafers capable of rapid determination of film conformality. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A conformality monitoring kit comprising:
   a high surface area ratio capacitor;
   a low surface area ratio capacitor;
   means for monitoring capacitance, electrically coupled to said capacitors; and
   means for converting capacitance into conformality, logically coupled to said monitoring means.

2. A conformality monitoring kit, according to claim 1, wherein said high surface area ratio capacitor comprises:
   a first region of semiconductor material;
   a first region comprising shallow trench isolation defined on said first region of semiconductor material;
   a first conductive pad deposited on said first shallow trench isolation wherein said first conductive pad has conducting lines and has a high surface area ratio;
   a first dielectric film deposited on said first conductive pad and lines; and
   a first array of electrically conductive material disposed on said first dielectric film.

3. A conformality monitoring kit, according to claim 1, wherein said low surface area ratio capacitor comprises:
   a second region of semiconductor material,
   a second region comprising shallow trench isolation defined on said second region of semiconductor material,
   a second conductive pad deposited on s aid second shallow trench isolation wherein said second conductive pad has conducting lines and has a low surface area ratio;
   a second dielectric film deposited on said second conductive pad and lines; and
   a second array of electrically conductive material disposed on said second dielectric film.

4. A conformality monitoring kit, according to claim 1, wherein said capacitance monitoring means comprise MOS test equipment.

5. A conformality monitoring kit, according to claim 1, wherein said capacitance converting means comprise an algorithm.

6. A conformality monitoring kit, according to claim 1, wherein said high surface area ratio is at least 100:1.

7. A conformality monitoring kit, according to claim 1, wherein said high surface area ratio is at least 200:1.

8. A conformality monitoring kit, according to claim 1, wherein said high surface area ratio is at least 300:1.

9. A conformality monitoring kit, according to claim 1, wherein said low surface area ratio is about 1:1.

10. A conformality monitoring kit, according to claim 1, wherein said low surface area ratio is about 0.5:1.

11. A conformality monitoring kit, according to claim 5, wherein said algorithm comprises the equation:

$$\text{Conformality} = d_{per}/d_{top} = [C_{flat}/A_{flat}]/\{[C_T - C_{flat}(A_{top}/A_{flat})]/(A_{per})\}.$$

12. A conformality monitoring kit, according to claim 5, wherein said algorithm comprises the equation:

$$\text{Conformality} = F.\ (A_{per}/A_{flat}) \times \{C_{flat}/[C_T - C_{flat}(A_{top}/A_{flat})]\}$$

13. A conformality monitoring kit, according to claim 1, wherein said first and said second capacitors are mounted on the same wafer.

14. A conformality monitoring kit, according to claim 1, wherein said first and said second capacitors are mounted on separate wafers.

15. A conformality monitoring kit, according to claim 14, wherein said shallow trench isolation covers substantially the entire area of the wafer, and wherein said conductive pad covers substantially the entire surface area of said shallow trench isolation.

16. A conformality monitoring kit, according to claim 1, wherein said electrically conductive material comprises any conveniently definable highly conductive material.

17. A conformality monitoring kit, according to claim 1, wherein said electrically conductive material is a conveniently definable highly conductive material selected from the group consisting of Al, Cu, W, and $WSi_x$.

18. A conformality monitoring kit, according to claim 17, wherein said electrically conductive material is disposed in an array of 1–4 millimeter dots.

19. A conformality monitoring kit, according to claim 1, wherein said trench isolation comprises any conveniently-definable material having a low dielectric constant.

20. A conformality monitoring kit, according to claim 1, wherein said trench isolation is a material having a low dielectric constant selected from the group consisting of silicon dioxide, silicon nitride, and sapphire.

21. A conformality monitoring kit, according to claim 1, wherein said conductive pad comprises any conveniently-definable, electrically conductive material.

22. A conformality monitoring kit, according to claim 1, wherein said conductive pad is an electrically conductive material selected from the group consisting of n+ doped polysilicon, p+ doped polysilicon, W, $Wsi_x$, Al, and Cu.

23. A conformality monitoring kit, according to claim 1, wherein said dielectric film is a silicon oxide or nitride selected from the group consisting Of $SiO_2$, $Si_3N4$, and $SiO_xN_y$.

24. A conformality monitoring kit, according to claim 1, wherein said dielectric film is a metal oxide selected from the group consisting of $Al_2O_3$, $ZrSiO_4$, $TiO_2$, $Ta_2O_5$, $ZrO_2$, and other metal oxides.

25. A conformality monitoring kit, according to claim 1, wherein said dielectric film is a perovskite.

26. A method of measuring the conformality of a film comprising:
providing a first capacitor having a high surface area ratio;
providing a second capacitor having a low surface area ratio;
providing means of monitoring capacitance of said first and said second capacitors wherein said monitoring means are electrically connected to said first and said second capacitors;
providing an algorithm for converting said capacitance into conformality wherein said algorithm is logically coupled to said monitoring means; and
converting capacitance into conformality using said algorithm.

27. A method of measuring the conformality of a film, according to claim 26, wherein said high surface area ratio capacitor comprises:
a first region of semiconductor material;
a first region of shallow trench isolation defined on said first region of semiconductor material;
a first conductive pad deposited on said first shallow trench isolation wherein said first conductive pad has conducting lines and has a high surface area ratio;
a first dielectric film deposited on said first conductive pad and lines; and
a first array of electrically conductive material disposed on said first dielectric film.

28. A method of measuring the conformality of a film, according to claim 26, said low surface area ratio capacitor comprises:
a second region of semiconductor material,
a second region comprising shallow trench isolation defined on said second region of semiconductor material,
a second conductive pad deposited on said second shallow trench isolation wherein said second conductive pad has conducting lines and has a low surface area ratio;
a second dielectric film deposited on said second conductive pad and lines; and
a second array of electrically conductive material disposed on said second dielectric film.

29. A method of measuring the conformality of a film, according to claim 26, wherein said capacitance monitoring means comprise a MOS tester.

30. A method of measuring the conformality of a film, according to claim 26, wherein said algorithm comprises the equation:

$$\text{Conformality} = d_{per}/d_{top} = [C_{flat}/A_{flat}]/\{[C_T - C_{flat}(A_{top}/A_{flat})]/(A_{per})\}.$$

31. A method of measuring the conformality of a film, according to claim 26, wherein said algorithm comprises the equation:

$$\text{Conformality} = F \cdot (A_{per}/A_{flat}) \times \{C_{flat}[C_T C_{flat}(A_{top}/A_{flat})]\}$$

32. A method of measuring the conformality of a film, according to claim 26, wherein said high surface area ratio is at least 100:1.

33. A method of measuring the conformality of a film, according to claim 26, wherein said high surface area ratio is at least 200:1.

34. A method of measuring the conformality of a film, according to claim 26, wherein said high surface area ratio is at least 300:1.

35. A method of measuring the conformality of a film, according to claim 26, wherein said low surface area ratio is about 1:1.

36. A method of measuring the conformality of a film, according to claim 26, wherein said low surface area ratio is about 0.5:1.

37. A method of measuring the conformality of a film, according to claim 26, wherein said first and said second capacitors are mounted on the same wafer.

38. A method of measuring the conformality of a film, according to claim 26, wherein said first and said second capacitors are mounted on the separate wafers.

39. A method of measuring the conformality of a film, according to claim 26, wherein said shallow trench isolation covers substantially the entire area of the wafer, and wherein said conductive pad covers substantially the entire surface area of said shallow trench isolation.

40. A method of measuring the conformality of a film, according to claim 26, wherein said electrically conductive material comprises any conveniently definable highly conductive material.

41. A method of measuring the conformality of a film, according to claim 26, wherein said electrically conductive material is a conveniently definable highly conductive material selected from the group consisting of Al, Cu, W, and $WSi_x$.

42. A method of measuring the conformality of a film, according to claim 26, wherein the electrically conductive material is disposed in an array of 1–4 millimeter dots.

43. A method of measuring the conformality of a film, according to claim 26, wherein said trench isolation comprises any conveniently-definable material having a low dielectric constant.

44. A method of measuring the conformality of a film, according to claim 26, wherein said trench isolation is a material having a low dielectric constant selected from the group consisting of silicon dioxide, silicon nitride, and sapphire.

45. A method of measuring the conformality of a film, according to claim 26, wherein said conductive pad comprises any conveniently-definable, electrically conductive material.

46. A method of measuring the conformality of a film, according to claim 26, wherein said conductive pad is an electrically conductive material selected from the group consisting of n+doped polysilicon, p+doped polysilicon, W, $WSi_x$, Al, and Cu.

47. A method of measuring the conformality of a film, according to claim 26, wherein said dielectric film is a silicon oxide or nitride selected from the group consisting of $SiO_2$, $Si_3N4$, and $SiO_xN_y$.

48. A method of measuring the conformality of a film, according to claim 26, wherein said dielectric film is a metal oxide selected from the group consisting of $Al_2O_3$, $ZrSiO_4$, $TiO_2$, $Ta_2O_5$, $ZrO_2$, and other metal oxides.

49. A conformality monitoring kit, according to claim 1, wherein said dielectric film is a perovskite.

50. A method for determining critical process parameters, according to claim 26, comprising establishing a set of standard process parameters;
determining a standard film conformality;
establishing an experimental set of process parameters;
determining an experimental film conformality; and
comparing the experimental conformality to the standard conformality.

\* \* \* \* \*